(12) United States Patent
Zha et al.

(10) Patent No.: US 11,669,281 B1
(45) Date of Patent: Jun. 6, 2023

(54) COUNT CIRCUIT FOR SYMBOL STATISTICS

(71) Applicant: Meta Platforms, Inc., Menlo Park, CA (US)

(72) Inventors: Xianliang Zha, El Dorado Hills, CA (US); Yunqing Chen, Los Altos, CA (US); Shiyan Pan, San Jose, CA (US); Harikrishna Madadi Reddy, San Jose, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 20 days.

(21) Appl. No.: 17/531,393

(22) Filed: Nov. 19, 2021

(51) Int. Cl.
*G06F 3/06* (2006.01)
*G11C 7/10* (2006.01)

(52) U.S. Cl.
CPC .......... *G06F 3/0673* (2013.01); *G06F 3/0625* (2013.01); *G06F 3/0637* (2013.01); *G11C 7/1039* (2013.01)

(58) Field of Classification Search
CPC .... G06F 3/0673; G06F 3/0625; G06F 3/0637; G11C 7/1039
USPC .......................................................... 711/154
See application file for complete search history.

(56) References Cited

U.S. PATENT DOCUMENTS

| | | | | |
|---|---|---|---|---|
| 3,289,490 A | * | 12/1966 | Redmond, Jr. | B64C 13/00 74/599 |
| 6,091,141 A | * | 7/2000 | Heo | H01L 24/11 257/781 |
| 6,697,371 B1 | * | 2/2004 | Liang | H04L 49/351 370/389 |
| 6,745,265 B1 | * | 6/2004 | Sindalovsky | G06F 5/12 710/60 |
| 7,293,158 B2 | * | 11/2007 | Calvignac | H04L 49/901 711/155 |
| 9,565,016 B2 | * | 2/2017 | Wostyn | H04L 9/003 |
| 9,715,914 B1 | * | 7/2017 | Pagnanelli | G11C 7/222 |
| 10,097,833 B2 | * | 10/2018 | Fu | H04N 19/13 |
| 10,735,736 B2 | | 8/2020 | He | |
| 2012/0239902 A1 | * | 9/2012 | Moran | G06F 11/348 711/E12.001 |

(Continued)

OTHER PUBLICATIONS

Pradhan A.K., et al., "FPGA based High Performance CAVLC Implementation for H.264 Video Coding," International Journal of Computer Applications (0975-8887), May 2013, vol. 69, No. 10, pp. 23-28.

(Continued)

*Primary Examiner* — Christopher B Shin
(74) *Attorney, Agent, or Firm* — Van Pelt, Yi & James LLP

(57) ABSTRACT

A count circuit for symbol statistics is disclosed that is configured to read from an address of a buffer memory a count value stored at the address in response to receiving a first of a plurality of input values comprising the address, serially increment the count value for each of the received plurality of input values comprising the address, and write an incremented count value at the address of the buffer memory after a last of the plurality of input values comprising the address has been counted. Reading from the buffer memory is disabled for all but the first of the plurality of input values comprising the address. Writing to the buffer memory is disabled for all but the last of the plurality of input values comprising the address.

20 Claims, 2 Drawing Sheets

(56) References Cited

U.S. PATENT DOCUMENTS

| | | | | |
|---|---|---|---|---|
| 2012/0278541 | A1* | 11/2012 | Yamaki | G06F 12/0246 |
| | | | | 711/E12.008 |
| 2013/0315259 | A1* | 11/2013 | Boden | H04L 49/9084 |
| | | | | 370/412 |
| 2015/0091927 | A1* | 4/2015 | Cote | G06T 1/60 |
| | | | | 345/547 |
| 2017/0019679 | A1* | 1/2017 | Wang | H04N 19/423 |
| 2017/0164007 | A1 | 6/2017 | Converse | |

OTHER PUBLICATIONS

Sarwer M.G., et al., "Transform-Domain Rate-Distortion Optimization Accelerator for H.264/AVC Video Encoding," International Journal of Signal Processing, 2009, 5:3, pp. 238-248.

\* cited by examiner

COUNT CIRCUIT FOR SYMBOL STATISTICS

BACKGROUND

Symbol statistics processes include counting coefficients and states comprising various elements or values of different categories or contexts. Typical counters used in symbol statistics circuits are not efficient due to requiring frequent redundant read and/or write operations. Thus, a more efficient count circuit with lower power consumption is needed for symbol statistics.

BRIEF DESCRIPTION OF THE DRAWINGS

Various embodiments of the disclosure are disclosed in the following detailed description and the accompanying drawings.

DETAILED DESCRIPTION

Figure 1:
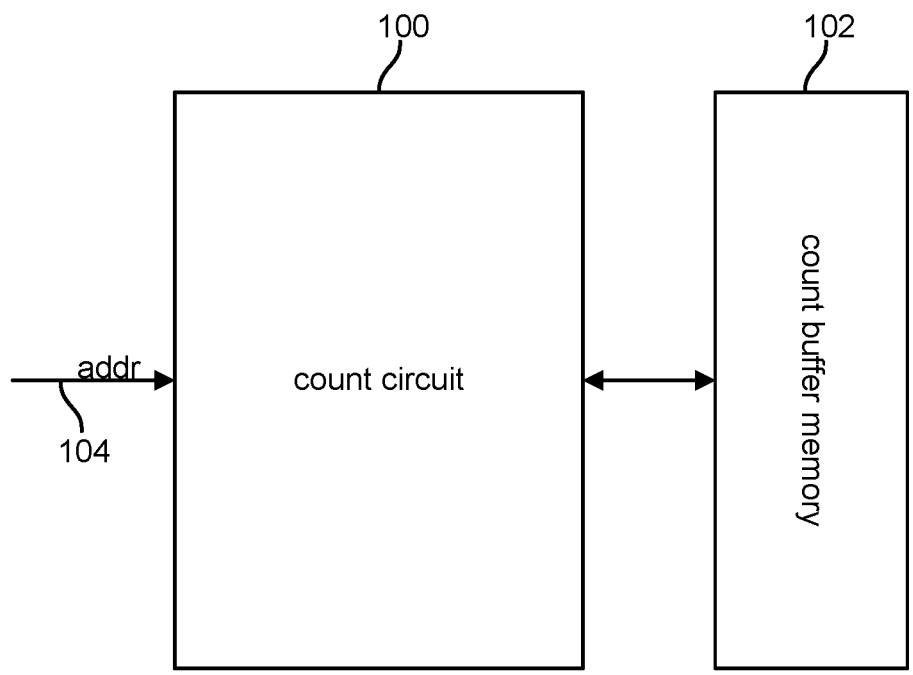
FIG. 1 is a high level block diagram illustrating an embodiment of a count circuit.

The disclosure can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the disclosure may take, may be referred to as techniques. In general, the order of the steps of disclosed processes may be altered within the scope of the disclosure. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the disclosure is provided below along with accompanying FIGS. that illustrate the principles of the disclosure. The disclosure is described in connection with such embodiments, but the disclosure is not limited to any embodiment. The scope of the disclosure is limited only by the claims, and the disclosure encompasses numerous alternatives, modifications, and equivalents. Numerous specific details are set forth in the following description in order to provide a thorough understanding of the disclosure. These details are provided for the purpose of example, and the disclosure may be practiced according to the claims without some or all of these specific details. For the purpose of clarity, technical material that is known in the technical fields related to the disclosure has not been described in detail so that the disclosure is not unnecessarily obscured.

The disclosure includes a system comprising a buffer memory configured to store count values and a count circuit configured to read from an address of the buffer memory a count value stored at the address in response to receiving a first of a plurality of input values comprising the address, serially increment the count value for the received plurality of input values comprising the address, and write an incremented count value at the address of the buffer memory after a last of the plurality of input values comprising the address has been counted, wherein reading from the buffer memory is disabled for all but the first of the plurality of input values comprising the address and wherein writing to the buffer memory is disabled for all but the last of the plurality of input values comprising the address. Moreover, the disclosure includes a method comprising reading from an address of a buffer memory a count value stored at the address in response to receiving a first of a plurality of input values comprising the address, configuring a count circuit to serially increment the count value for the received plurality of input values comprising the address, and writing an incremented count value at the address of the buffer memory after a last of the plurality of input values comprising the address has been counted by the count circuit, wherein reading from the buffer memory is disabled for all but the first of the plurality of input values comprising the address and wherein writing to the buffer memory is disabled for all but the last of the plurality of input values comprising the address. Furthermore, the disclosure includes a computer program product embodied in a non-transitory computer readable medium and comprising computer instructions for reading from an address of a buffer memory a count value stored at the address in response to receiving a first of a plurality of input values comprising the address, configuring a count circuit to serially increment the count value for the received plurality of input values comprising the address, and writing an incremented count value at the address of the buffer memory after a last of the plurality of input values comprising the address has been counted by the count circuit, wherein reading from the buffer memory is disabled for all but the first of the plurality of input values comprising the address and wherein writing to the buffer memory is disabled for all but the last of the plurality of input values comprising the address.

A codec generally comprises hardware and software components for encoding (compressing) and decoding (decompressing) data signals, such as multimedia content, that in their raw format consume substantial bandwidth. Compression facilitates more efficient storage and transmission of such content but typically at the expense of some loss of information.

A video codec is specifically employed to more efficiently store and deliver video content and comprises encoding and decoding video data according to a prescribed video coding format or standard. More specifically, encoding comprises processing stages associated with compressing video data, and decoding comprises processing stages associated with inverting the compression to the extent possible. Video content is typically processed frame by frame. Moreover, each frame is typically divided into a plurality of blocks of pixels that are processed in a prescribed order, such as a raster scan order, i.e., from left to right and from top to bottom of the frame.

A frame may generally be partitioned and processed in any appropriate manner. For example, a frame may be divided into a plurality of (raster ordered) super blocks. A super block (SB) may be divided into one or more coding units that partition the super block into arbitrary rectangular regions. For example, a super block may be recursively partitioned into one or more square coding units. A coding unit (CU) may be divided into one or more prediction units of possibly different block sizes. A prediction unit (PU) comprises the basic or elementary processing unit for intra-prediction and inter-prediction and stores prediction data such as intra-prediction angle or inter-prediction motion vector. A prediction unit comprises luminance and chrominance (e.g., YUV, YCbCr) components. A prediction unit may be divided into a plurality of transform units. A transform unit (TU) comprises the basic or elementary processing unit for transform and quantization and stores transform data, i.e., coefficient values. In some embodiments, a frame is partitioned into hierarchical levels of processing blocks or units according to a prescribed codec format such as VP9.

A transform unit (TU) comprises a matrix of coefficients. A TU packet comprises a sequence of (coefficient, coefficient index) pairs specified in, for example, raster order. In such cases, the coefficient index is incremented from left to right and from top to bottom with respect to a matrix of coefficients and indicates a raster order position of each coefficient in the matrix. TU coefficient values comprise raw quantization values and thus, in many cases, have substantial bit depth. Such coefficient values may be converted into a more compact token format or representation for more efficient storage and processing. Moreover, an order of TU coefficients or corresponding tokens may be modified according to an associated scan table for more efficient storage and processing.

An encoder and/or decoder process may at least in part be based on coefficient processes, such as symbol statistics. Symbol statistics may be employed, for example, with respect to a current frame final probability generation process and a next frame initial probability prediction process to facilitate achieving a highly compressed bitstream with desired quality. A symbol statistics process comprises counting numbers of coefficient or state symbols comprising various elements or values of different categories or contexts. A count circuit for symbol statistics comprising an improved data forwarding technique that eliminates redundant memory read and write operations to reduce power consumption during count operations is disclosed herein.

FIG. 1 is a high level block diagram illustrating an embodiment of a count circuit. Count circuit 100 may be employed, for example, for coefficient and/or state counts during symbol statistics processes and may comprise a component of a symbol statistics circuit, e.g., that is used with respect to a VP9 codec. In some cases, a symbol statistics circuit may comprise a plurality of count circuits 100 configured in parallel for different counts. Count circuit 100 may be employed during symbol statistics processes, e.g., for dynamic on the fly count operations that are needed during symbol statistics processes at runtime.

Count circuit 100 saves power via data forwarding and eliminating redundant reads from and writes to count buffer memory 102. More specifically, memory write is disabled for a plurality of incoming counts that write to the same address. Moreover, memory read is disabled for a plurality of incoming counts that read from the same address. Thus, memory read from and write to the same address are eliminated while incrementing a count value within count circuit 100 that is associated with a given memory location of count buffer 102.

In some embodiments, count circuit 100 is configured as a counter to count numbers of coefficients comprising various elements or values of different categories or contexts during symbol statistics processes. Some examples of the types of values that count circuit 100 may be configured to count include: numbers of coefficients comprising each of a prescribed set of TU size values (e.g., 4×4, 8×8, 16×16, and 32×32) for a TU size category, numbers of coefficients comprising each of a prescribed prediction type (e.g., intra-prediction and inter-prediction) for a reference category, numbers of coefficients comprising each of a prescribed data type (e.g., luminance and chrominance) for a plan category, numbers of coefficients comprising each of a prescribed set of band values (e.g., 0-5) for a band category, and numbers of coefficients comprising each of a prescribed set of context values (e.g., 0-5) for a context category.

In FIG. 1, count circuit 100 reads data from and writes data to buffer memory 102. More specifically, count circuit 100 receives an address 104 of buffer memory 102 as an input and facilitates appropriately updating, i.e., incrementing, a count value stored at input address 104. Reading a count value from an address of buffer memory 102 and writing an incremented count value to the address of buffer memory 102 consumes power. Thus, it is desirable to eliminate any redundant reads from and writes to buffer memory 102 to facilitate improved efficiency and lower cost.

An opportunity for eliminating such redundancies occurs when a plurality of serially received input values comprises the same address, e.g., within a prescribed window of sequential values of input 104. The plurality comprising the same address may be consecutively received as input 104 within such a window and/or may not be consecutively received as input 104 within the window, i.e., if one or more other addresses are received as input 104 between one or more values of the plurality within the window. In some embodiments, a buffer memory 102 read is enabled to read a count value stored at a prescribed input address 104 when a first of a plurality of input values comprising the address is received and disabled for the rest of the plurality of input values comprising the same address. In some such cases, a buffer memory 102 read is enabled when an associated counting pipeline has no other counting value with the same read address within a prescribed window of serial values comprising input 104 and is disabled after a first read when an associated counting pipeline has a counting value comprising the same read address within a prescribed window of serial values comprising input 104. Count circuit 100 processes, i.e., updates or increments, a read count value for each of a received plurality of input values comprising a prescribed address as each is serially input 104 into count circuit 100. The input values comprising the prescribed address that are serially input 104 into count circuit 100 may not be consecutive in some embodiments, i.e., may be separated by one or more other addresses within a prescribed input window. Intermediate count values associated with serially processing or counting the plurality of input values comprising the same address are stored within count circuit 100 and not written to buffer memory 102. Buffer memory 102 writes are disabled while count circuit 100 processes or counts the plurality of input values comprising the same address. A buffer memory 102 write is enabled to write a final incremented count value to the address of buffer memory 102 after the last of the plurality of input values comprising the address has been processed or counted by count circuit 100. In some cases, a prescribed number of serial values or stages of input 104 are looked forward for a read and backward for a write. That is, an input window comprises a prescribed length or number of serial input values. In some embodiments, buffer memory 102 comprises a dual port memory.

As one illustrative example, consider that the input window has a length of three. Reads of an address are based on three forward stages of input 104 while writes of an address are based on three backward stages of input 104. Let input 104 comprise the following series of address values: A, B, C, A, E, B, B, E, B, D, A. For this example, read and write are enabled as follows and indicated in parentheses: A (read), B (read/write), C (read/write), A (write), E (read), B (read), B, E (write), B (write), D (read/write), A (read/write).

Figure 2:
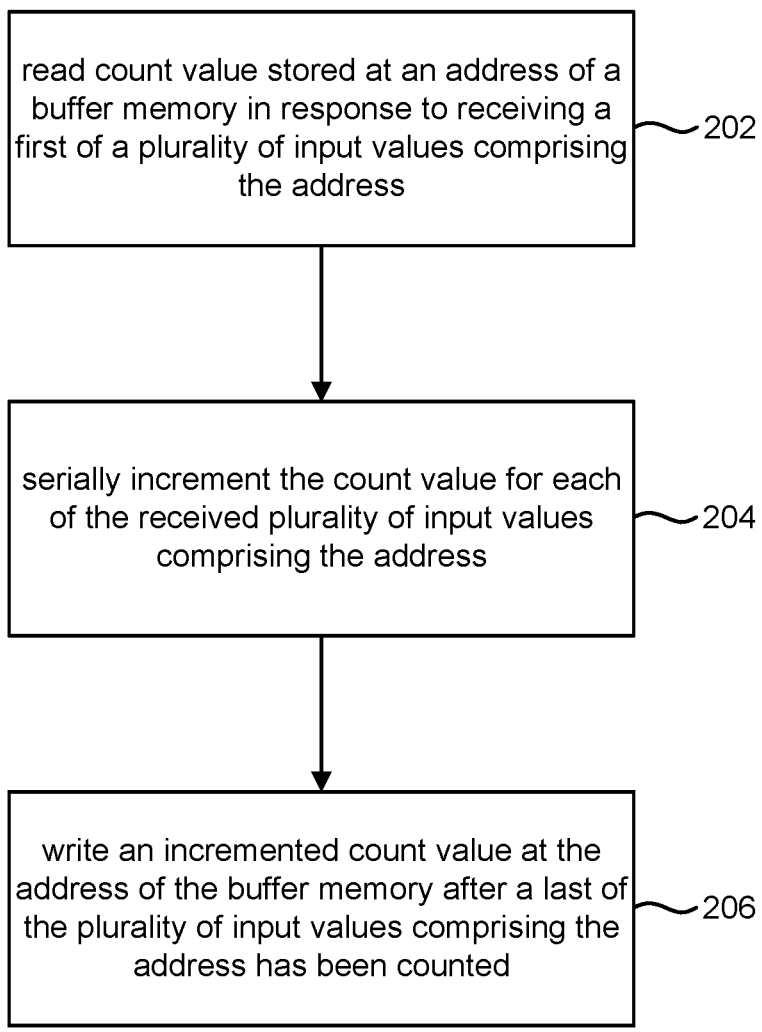
FIG. 2 is a high level flow chart illustrating an embodiment of a process for counting.

FIG. 2 is a high level flow chart illustrating an embodiment of a process for counting, e.g., during symbol statistics processes. In some embodiments, process 200 of FIG. 2 is employed by count circuit 100 of FIG. 1. Process 200 starts at step 202 at which a count value stored at an address of a buffer memory is read in response to receiving a first of a plurality of input values comprising the address. In some embodiments, reading from the buffer memory is disabled for all but the first of the plurality of input values comprising the address, e.g., within a prescribed input window. The plurality of input values may be consecutive or may not be consecutive within the prescribed input window. At step 204, the count value read at step 202 is serially incremented using a count circuit or counter for each of the received plurality of input values comprising the address. At step 206, an incremented count value is written at the address of the buffer memory after a last of the plurality of input values comprising the address has been counted by the count circuit. In some embodiments, writing to the buffer memory is disabled for all but the last of the plurality of input values comprising the address. Process 200 subsequently ends.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A system, comprising:
a buffer memory configured to store count values; and
a count circuit configured to:
read from an address of the buffer memory a count value stored at the address in response to receiving a first of a plurality of input values comprising the address;
serially increment the count value for the received plurality of input values comprising the address; and
write an incremented count value at the address of the buffer memory after a last of the plurality of input values comprising the address has been counted;
wherein reading from the buffer memory is disabled for all but the first of the plurality of input values comprising the address and wherein writing to the buffer memory is disabled for all but the last of the plurality of input values comprising the address.

2. The system of claim 1, wherein buffer memory read is enabled for only the first of the is plurality of input values comprising the address and wherein buffer memory write is enabled for only the last of the plurality of input values comprising the address.

3. The system of claim 1, wherein the count circuit facilitates data forwarding wherein an intermediate count value while processing the plurality of input values comprising the address is stored within the count circuit and not written to the buffer memory.

4. The system of claim 1, wherein the plurality of input values is not consecutive within a prescribed input window.

5. The system of claim 1, wherein the count circuit is configured to dynamically count on the fly during symbol statistics processes.

6. The system of claim 1, wherein the system comprises a symbol statistics circuit.

7. The system of claim 1, wherein the count value comprises a coefficient count or a state count.

8. A method, comprising:
reading from an address of a buffer memory a count value stored at the address in response to receiving a first of a plurality of input values comprising the address;
configuring a count circuit to serially increment the count value for the received plurality of input values comprising the address; and
writing an incremented count value at the address of the buffer memory after a last of the plurality of input values comprising the address has been counted by the count circuit;
wherein reading from the buffer memory is disabled for all but the first of the plurality of input values comprising the address and wherein writing to the buffer memory is disabled for all but the last of the plurality of input values comprising the address.

9. The method of claim 8, wherein buffer memory read is enabled for only the first of the plurality of input values comprising the address and wherein buffer memory write is enabled for only the last of the plurality of input values comprising the address.

10. The method of claim 8, wherein the count circuit facilitates data forwarding wherein an intermediate count value while processing the plurality of input values comprising the address is stored within the count circuit and not written to the buffer memory.

11. The method of claim 8, wherein the plurality of input values is not consecutive within a prescribed input window.

12. The method of claim 8, wherein the count circuit is configured to dynamically count on the fly during symbol statistics processes.

13. The method of claim 8, wherein the count circuit and buffer memory comprise a symbol statistics circuit.

14. The method of claim 8, wherein the count value comprises a coefficient count or a state count.

15. A computer program product embodied in a non-transitory computer readable medium and comprising computer instructions for:
reading from an address of a buffer memory a count value stored at the address in response to receiving a first of a plurality of input values comprising the address;
configuring a count circuit to serially increment the count value for the received plurality of input values comprising the address; and
writing an incremented count value at the address of the buffer memory after a last of the plurality of input values comprising the address has been counted by the count circuit;
wherein reading from the buffer memory is disabled for all but the first of the plurality of input values comprising the address and wherein writing to the buffer memory is disabled for all but the last of the plurality of input values comprising the address.

16. The computer program product of claim 15, wherein buffer memory read is enabled for only the first of the plurality of input values comprising the address and wherein buffer memory write is enabled for only the last of the plurality of input values comprising the address.

17. The computer program product of claim 15, wherein the count circuit facilitates data forwarding wherein an intermediate count value while processing the plurality of input values comprising the address is stored within the count circuit and not written to the buffer memory.

18. The computer program product of claim 15, wherein the plurality of input values is not consecutive within a prescribed input window.

19. The computer program product of claim 15, wherein the count circuit and buffer memory comprise a symbol statistics circuit.

20. The computer program product of claim 15, wherein the count value comprises a coefficient count or a state count.

* * * * *